United States Patent [19]
Hill et al.

[11] 3,977,566
[45] Aug. 31, 1976

[54] SEMICONDUCTOR WAFER HANDLING APPARATUS

[75] Inventors: Donald Franklin Hill, Allentown; Juris Strautins, Kintnersville, both of Pa.

[73] Assignee: Bell Telephone Laboratories, Incorporated, Murray Hill, N.J.

[22] Filed: Oct. 31, 1975

[21] Appl. No.: 627,620

[52] U.S. Cl. .............................. 221/222; 214/16.6
[51] Int. Cl.² ............................................. B65G 33/06
[58] Field of Search ................... 221/222, 297, 75; 198/213, 197, 281; 214/16.6, 16.4 R

[56] References Cited
UNITED STATES PATENTS

| | | | |
|---|---|---|---|
| 3,160,295 | 12/1964 | Roark | 214/16.6 |
| 3,323,856 | 6/1967 | Guckel | 221/222 X |

*Primary Examiner*—Stanley H. Tollberg
*Attorney, Agent, or Firm*—H. W. Lockhart

[57] ABSTRACT

Semiconductor wafer handling apparatus comprising a wafer feed machine, a dispensing adapter, and a collecting adapter is disclosed. The wafer feed machine is adapted for the transfer of a plurality of semiconductor wafers from or to a wafer cassette and to dispense or collect wafers singly, in a horizontal disposition to or from a work surface. The wafer feed machine comprises a frame-like support member in which are rotatably mounted a plurality of feed screw means which are axially parallel and spaced apart so as to accept in the periphery of the screw threads a standard semiconductor wafer. The pitch of the screw threads matches the spacing of standard wafer cassettes to enable batch transfer of wafers to and from the side of the wafer feed machine. Common drive means are provided for rotating the screw feed means which produces axial movement of the wafers. The machine has a dispensing mode for which a dispensing adapter is fitted to the feed screw outlet and the feed is toward the outlet, and a collecting mode in which a collecting adapter replaces the dispensing adapter and the screw feed is in the opposite direction.

8 Claims, 11 Drawing Figures

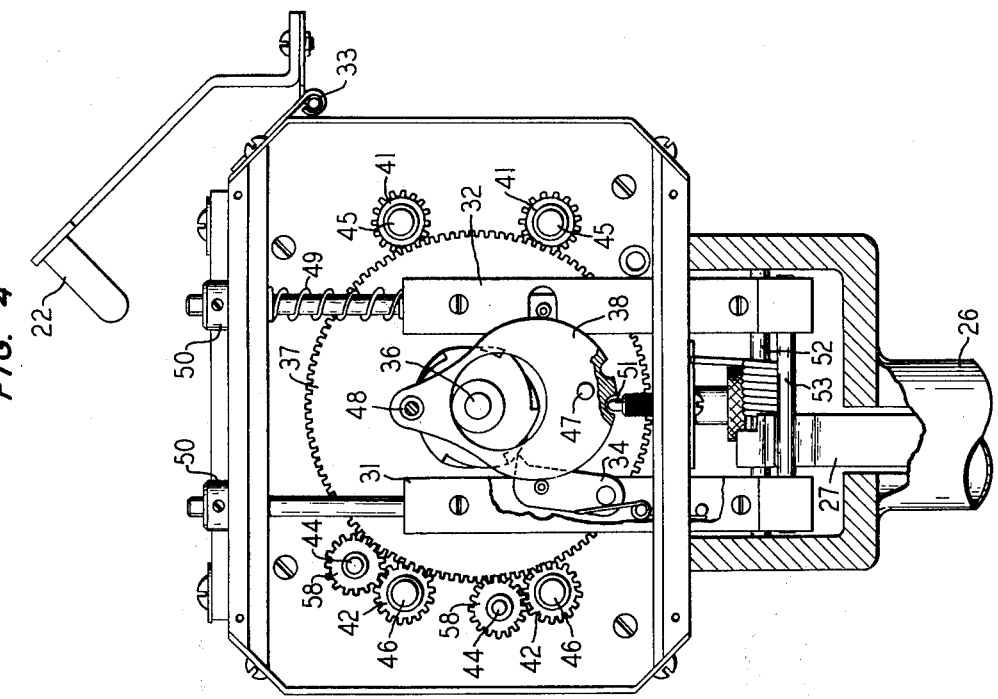
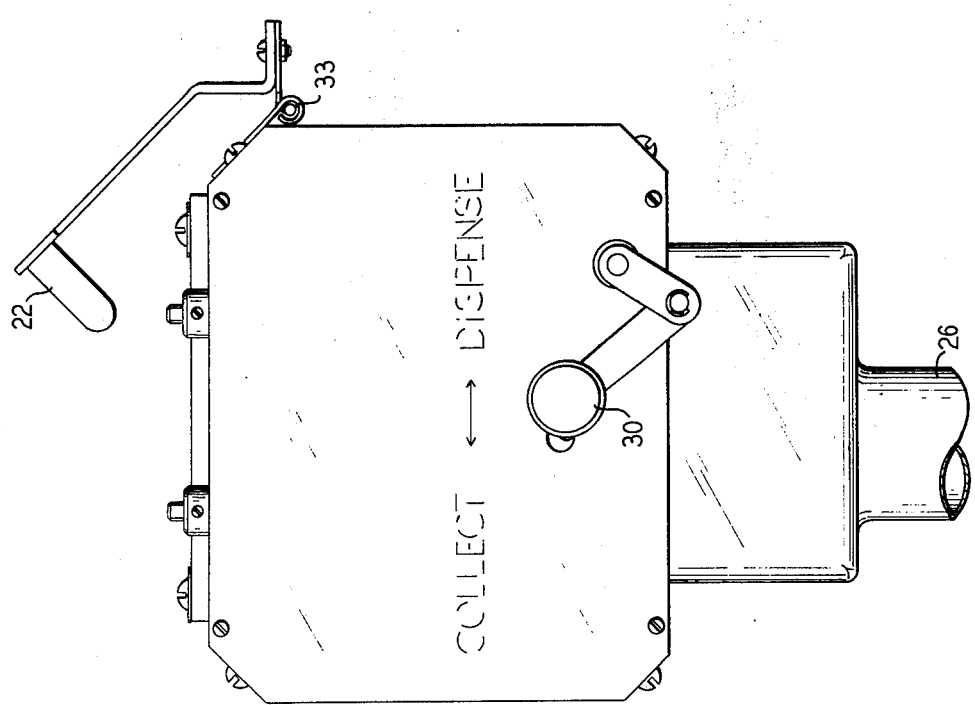

SEMICONDUCTOR WAFER HANDLING APPARATUS

BACKGROUND OF THE INVENTION

Semiconductor wafers are substantially circular slices of monocrystalline semiconductor material formed by slicing transversely the single crystal ingots which are the product of the crystal fabrication process. These wafers are the basic medium from which large numbers, hundreds or thousands, of individual semiconductor devices are made using well-known dielectric coating, photolithographic masking and impurity introduction techniques. These semiconductor wafers are highly polished on both faces and when prepared for introduction into the device fabrication process, in current practice, range in thickness typically from about 30 to as thin as 10 mils and are from 2 to 4 inches in diameter.

From this point in the fabrication process to the point at which the wafer is divided into a large number of individual device chips, these wafers, which have acquired considerable value, are transferred through a variety of processing stations. They are subjected to various steps including selective coating, metallization, impurity introduction, selective removal of surface materials and cleaning operations. The wafers are relatively fragile and their surfaces are readily damaged by mishandling with the result that they may be unusable for device fabrication.

The wafers are stored and processed in part in trough-like plastic containers, termed cassettes, which have transversely-disposed grooves to retain each individual wafer in spaced-apart relation. Many operations however, require placing wafers flat on a platform or plate such as is used in a sputtering or evaporation station. Heretofore, it has been the practice to utilize vacuum wands or special tweezers to handle individual wafers. This is a slow and tedious process, dependent to a considerable extent upon the performance of a skilled operator and open to the possibility of damage to the wafers.

Accordingly, an object of this invention is the transfer of semiconductor wafers from a cassette type of holder to the processing platform to which the wafer is delivered in a horizontal disposition at a specific location without the manual kind of wafer-by-wafer handling which has been the previous practice.

It is also an object to pick up individual wafers and arrange them in a spaced-apart stack for ready transfer to a cassette.

SUMMARY OF THE INVENTION

In accordance with the invention there is provided a wafer feed machine comprising a plurality of screw feed means rotatably mounted in a suitable support frame. The axes of the screw feed means are substantially parallel and spaced apart sufficiently to accept standard semiconductor wafers between the peripheral portions of the screw threads. Advantageously the pitch of the feed screws matches the spacing between the stowage grooves of a standard wafer cassette. The wafer feed machine is open on one side to admit a batch of semiconductor wafers by simultaneous transfer from or to a wafer cassette, thereby loading or unloading the feed machine. Gate means may be provided on this open side to retain loaded wafers.

Common drive means are provided for rotating the screw feed members simultaneously and uniformly that is, in synchronism. Typically, such means may comprise ratchet means to rotate a gear or wheel which drives the screw feed shafts. Rotation of the screw feed members causes the semiconductor wafers to move in the axial direction of the screw feed members, toward the open end of the machine in the dispensing mode, and in the reverse direction in the collecting mode.

In a specific embodiment the screw feed means comprises a pair of right-handed and a pair of left-handed counter rotating screws. A ratchet mechanism rotates a power wheel which in turn rotates each of the screw shafts. Suitable ratios may be selected to produce the desired advance of the wafers for given input drive motion. In this specific embodiment, the machine is designed for manual, portable use. However, it may be incorporated into semiautomatic apparatus for feeding a processing station.

In the dispensing mode, a dispensing adapter is fitted to the outlet end of the feed machine. The adapter is provided with suitable guide and positioning elements to enhance dispensing of single wafers as well as for accurately interfacing the machine outlet with particular wafer platforms.

In the collecting mode, a collecting adapter replaces the dispensing adapter and the direction of the feed screws is reversed. The collecting adapter includes a plurality of radially-disposed pivoting fingers which swing under a wafer and elevate it into the end of the feed screws which then feed it in the reverse direction in the wafer feed machine. Wafers reloaded in this fashion then can be transferred from the feed machine to a wafer cassette in a reversal of the cassette to feed machine transfer step.

BRIEF DESCRIPTION OF THE DRAWINGS

The invention and its other objects and features will be more clearly understood from the following description taken in conjunction with the drawings in which:

FIG. 3 is a top view of the wafer feed machine;

FIG. 4 is a top view of the wafer feed machine with cover and top plate removed;

DETAILED DESCRIPTION

Figure 1:
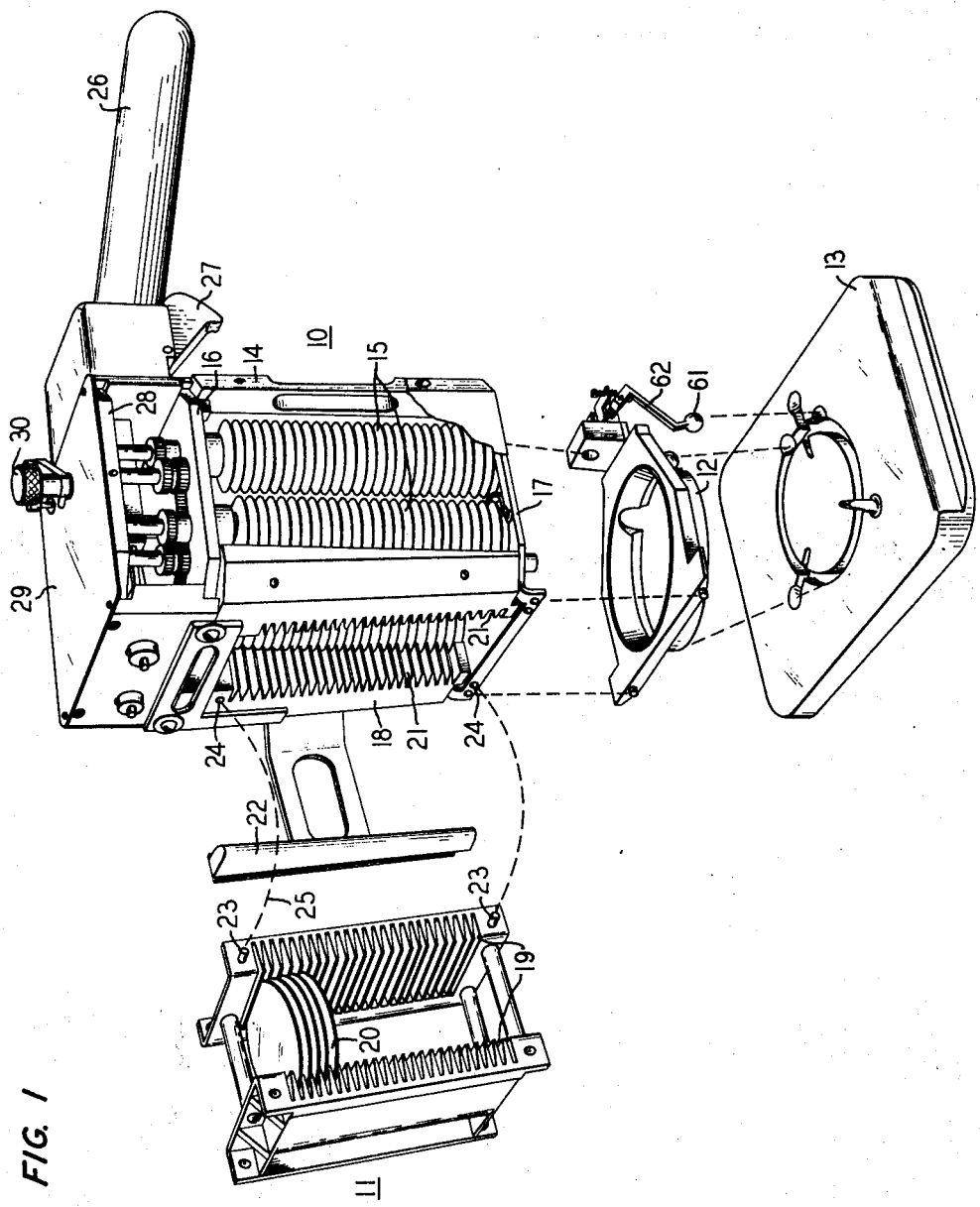
FIG. 1 is a perspective view, partially cut away, of the wafer feed machine, dispensing adapter, mounting base and wafer cassette in spaced-apart relation.

FIG. 1 shows the wafer feed machine 10, a wafer cassette 11, dispensing adapter 12, and base member 13 in spaced-apart relation showing their functional relationship. The wafer feed machine has sides partially cut away or omitted to disclose the working parts thereof. The wafer feed machine comprises a frame-like support member 14 which supports and houses four feed screw members 15, two of right-hand and two of left-hand configuration. These screw members 15 are rotatably mounted in bearings in the top plate 28 and upper plate 16 of the support frame. The bottom plate 17 provides a partial floor. The front face 18 of the wafer feed machine comprises an array of oppositely disposed combs 21 comprising grooved members having the same width and spacing as the screw feed members. The width of the screws 15 is designed to accept a standard semiconductor wafer as can be seen more clearly from the wafer cassette 11 which has similar grooves 19 for accepting a spaced-apart stack of wafers 20. The two pairs of feed screws 15 are spaced apart sufficiently to accept, in the space between their peripheral portions, a semiconductor wafer of standard dimensions. The pitch of the screws equals the spacing of the grooves 19 in the wafer cassette and the matching grooves of the combs 21 in the loading face 18 of the wafer feed machine 10.

The wafer feed machine 10 is loaded with a stack of semiconductor wafers 20 by placing the open face of the wafer cassette against the loading face 18 of the wafer feed machine 10. During this operation the retainer gate member 22 is held in the open position, and the cassette 11 is conveniently positioned by mating the alignment pins 23 and recesses 24 as indicated by the broken lines 25 between the two members. Once placed together, the wafers are dump-transferred from the cassette 11 to the wafer feed machine 10 by gravity. Thus, all the wafers in the cassette roll substantially simultaneously through the entrance combs 21 and into the peripheries of the feed screws 15.

The wafer feed machine 10 is shown in greater detail and from various aspects in FIGS. 2, 3, 4, 5 and 6. In this description certain parts of the machine will be denoted as right or left and it will be understood that this orientation is taken as viewed from the back or handle side of the machine. Moreover, although the machine will be described in a specific embodiment in considerable detail, certain more obvious machine details have been omitted as unnecessary in a disclosure directed to those skilled in the art. It will also be understood that a variety of alternatives may be devised for accomplishing the various functions described in this specific embodiment. The important features of the wafer feed machine are the feed screws 15 which are designed to have a thread pitch which accepts the thin semiconductor wafers between the threads, and are spaced apart so as to accept within their peripheries a wafer of standard size. An associated important feature is the provision of a loading face 18 on one side of the machine which accepts the standard wafer cassette 11 and enables batch loading of a stack of wafers 20 into wafer feed machine 10. Another important feature is the means, at one end, of the feed screws 15, for dispensing or collecting a single wafer in the horizontal disposition.

The right-hand pair and left-hand pair of feed screws 15 have oppositely disposed threads. That is, the pair on the right are right-handed and the pair on the left are left-handed screw threads and, as will be explained hereinafter, are counter-rotating so as to provide for uniform axial movement of wafers held by the feed screws 15. In this specific embodiment, two opposed pairs of counter-rotating feed screws are described as the preferred arrangement. Other arrangements of feed screws may be devised and adopted for reasons of economy or utility. For example, as a minimum it would be possible to accomplish the feed screw function with as few as two feed screws. Three feed screws disposed 120° apart might be used if suitable clearances provided for entry of the wafers. Schemes utilizing more than two pairs of feed screws introduced additional complications with respect to the drive mechanism and the provision of the necessary counter-rotation.

Figure 2:
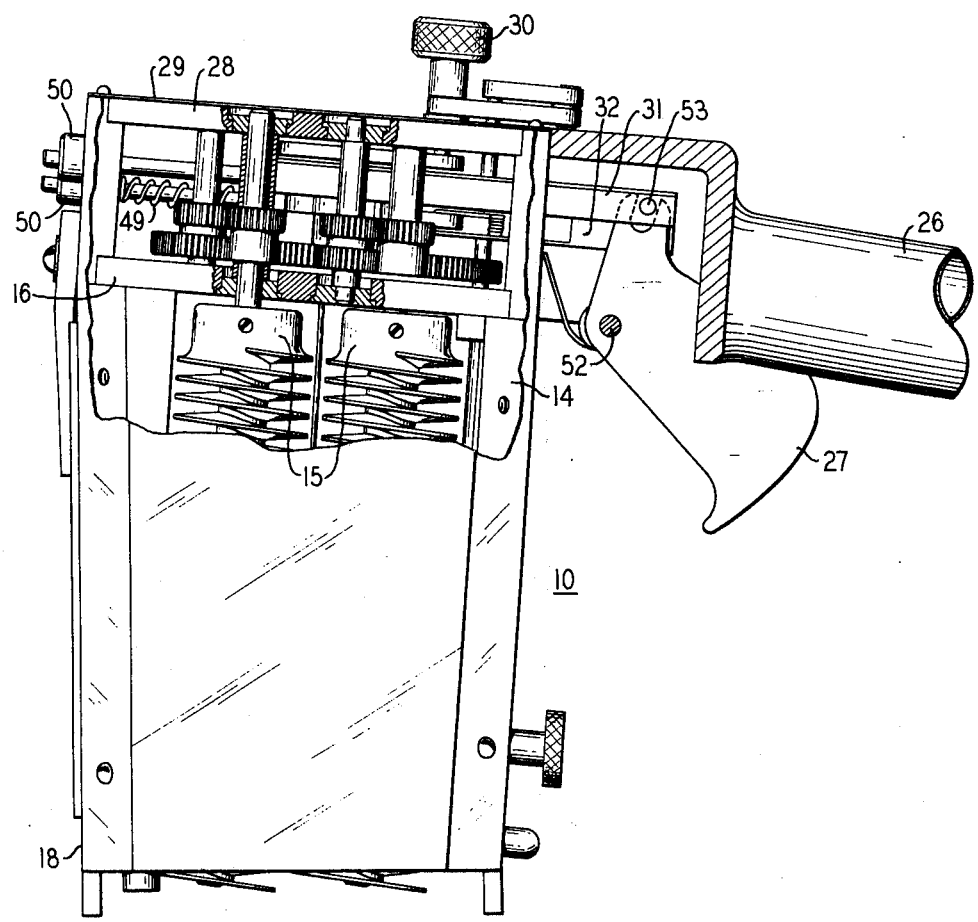
FIG. 2 is a side elevation, partially cut away of the wafer feed machine.
Figure 5:
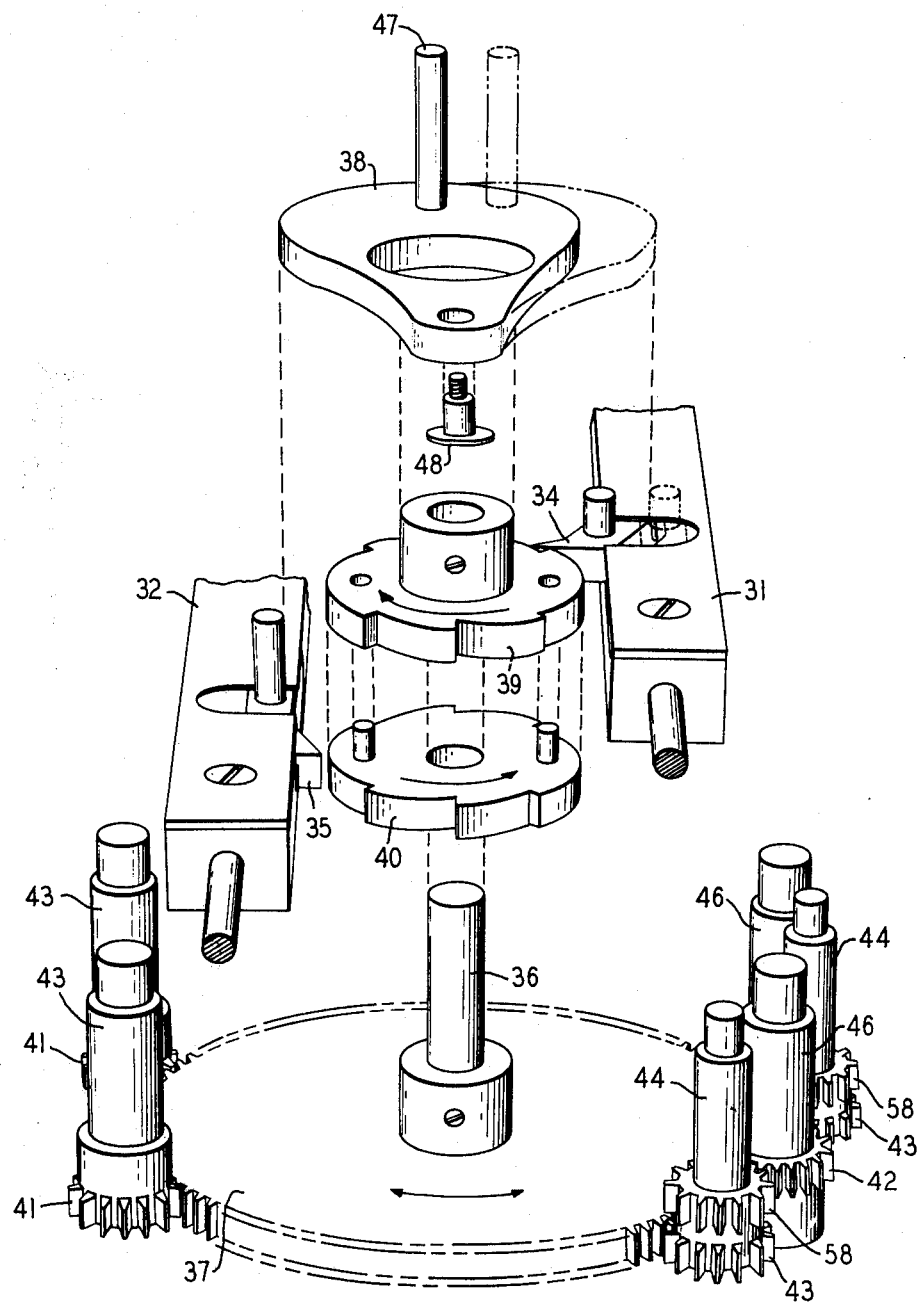
FIG. 5 is a front perspective view, in exploded form, of the cam, ratchet, and gear mechanism comprising the drive train.
Figure 6:
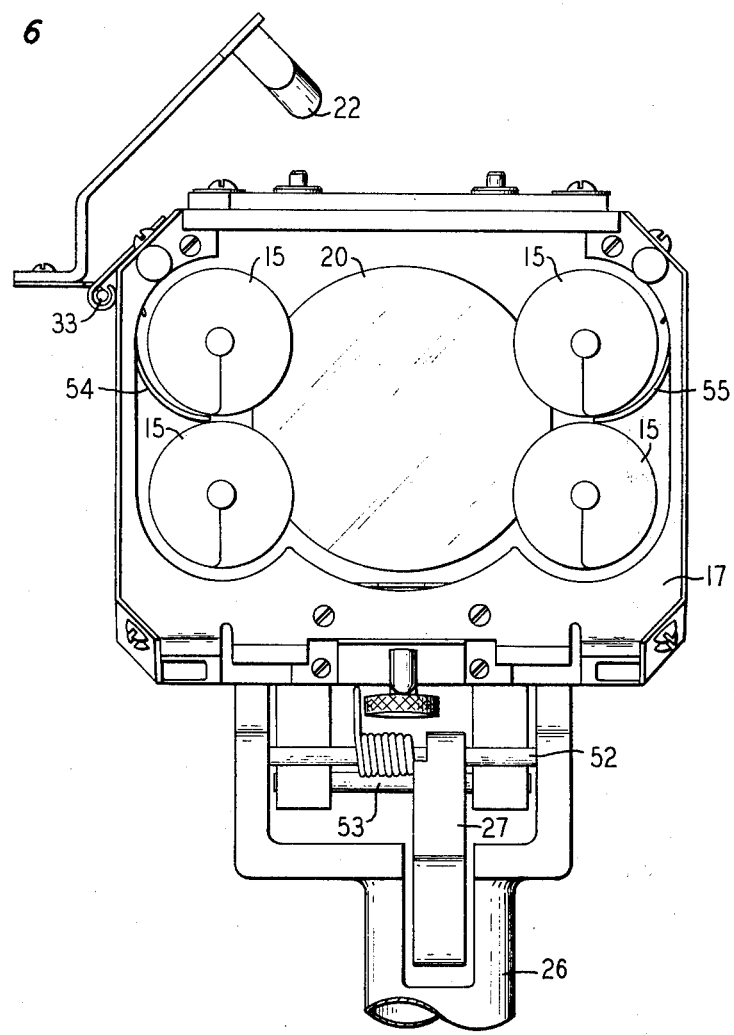
FIG. 6 is a bottom view of the wafer feed machine.

The drive mechanism for the wafer feed screws 15 is housed within the top portion of the wafer feed machine 10, between the upper plate 16 and the top plate 28. In this embodiment, the machine 10 is fitted with a handle 26 for manual operation. As shown in FIGS. 2, 4 and 6, a trigger 27 is mounted next to the handle 26 and pivoted on the trigger shaft 52. A slot in the trigger engages a shaft 53 which is affixed to a pair of pawl slides 31 and 32, best seen in FIGS. 4 and 5. The left and right pawl slides 31 and 32, respectively, each house a pawl 34 and 35 designed to engage a corresponding ratchet member 39 and 40, respectively, pinned to a central drive shaft 36. Referring particularly to the exploded view of FIG. 5, the left pawl 34 engages the upper ratchet 39 and the lower pawl 35 engages the lower ratchet 40. The upper ratchet 39 is pinned to the drive shaft 36 and the lower ratchet 40 is forced to rotate with the upper ratchet 39 by the pins shown on its upper face which engage the holes in the upper ratchet 39. Engagement of the pawls 34 and 35 is controlled by the position of the cam 38 which is moved to the collect or dispense position by the selector knob 30 affixed to the pin 47. The cam 38 pivots about the pin 48 which is threaded into the cover plate 28. The cam 38 is shaped so as to constrain one or the other pawl within its housing by bearing against the pin attached to the upper face of each pawl. Referring to FIG. 4, the cam 38 is retained in one or the other position by the spring loaded detent 51. The right and left pawls 34 and 35 likewise are both spring-loaded to normally bias them into the outward or engaged position.

Thus pressing the trigger 27 upward into the handle 26 against the bias of the spring on the trigger shaft 52 forces the pawl slides 31 and 32 forward against the bias of the pawl slide spring 49. With the cam 38 set in the dispense position, with the lobe to the right as viewed from the handle, the right pawl 35 is constrained within its slide 32, while the left pawl 34 engages the upper ratchet 39 which rotates clockwise, as viewed from above, as the pawl slide is moved forward by the motion of the trigger. With continued forward motion of the pawl slides, the shape of cam 38 permits right pawl to emerge from its constrained position within slide 32. Thus, near the end of the drive stroke the right pawl 35 engages the lower ratchet 40 and inhibits any inertial movement of the drive train which would prevent accurate vertical positioning of the wafer stack. When the cam is in the collect position the left pawl 34 is housed and the right pawl 35 engages the lower ratchet 40 and forward motion of the pawl slide 32 produces a counterclockwise motion of the ratchet 40 in the same fashion as described above for clockwise motion.

As previously noted, ratchets 39 and 40 are so pinned to the drive shaft 36 that the ratchet rotation is directly transferred to the drive shaft 36 and in turn to the drive gear 37. The drive gear 37 in turn engages the right side spur gears 41 which drive the right feed screw shafts 43. On the other periphery of the drive gear 37, it engages lower idler gears 43 mounted on idler shafts 44 which also carry upper idler gears 58. The idler gears 58 engage spur gears 42 affixed to the left feed screw shafts 46. This idler gear arrangement is employed to reverse the direction of rotation of the left feed screws, thus making the right and left feed screws counterrotating. The pawl slides are fitted with stops 50 which limit their travel in the retracted position. In this particular embodiment it will be noted that the ratchets 39 and 40 have six equally spaced teeth so that one stroke of the trigger produces 1/6th of a revolution of the ratchets 39 or 40 and thus of drive shaft 36 and drive gear 37. The spur gears are all of the same size and number of teeth and have 1/6th the number of teeth of the drive gear 37. Thus, one stroke of the trigger 27 produces one revolution of the feed screws 15 which produces an advance in the axial direction of a wafer an amount equal to the single thread pitch.

The wafer feed machine 10 advantageously is fitted with appurtenances, such as the retainer gate 22 which rotates about the hinge 33 from the open or loading position to a closed position which retains the wafers in place within the feed screws 15. The position of a wafer 20 in the feed machine 10 is illustrated in FIG. 6. Wire guides 54 and 55 also are provided to aid in positioning the wafer 20 in the periphery of the feed screws 15.

Figure 7:
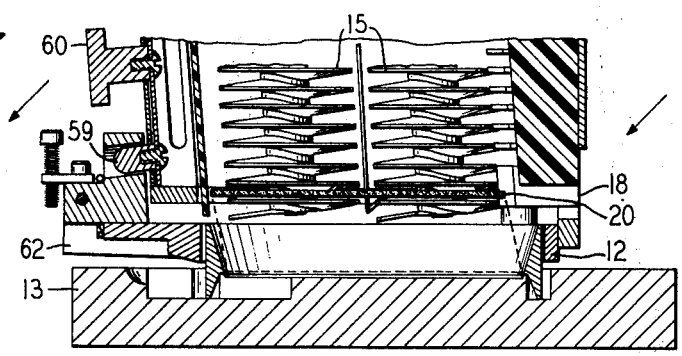
FIG. 7 is a side elevation view, in section, of the lower portion of the wafer feed machine with attached dispensing adapter and mounted on a base member.
Figure 8:
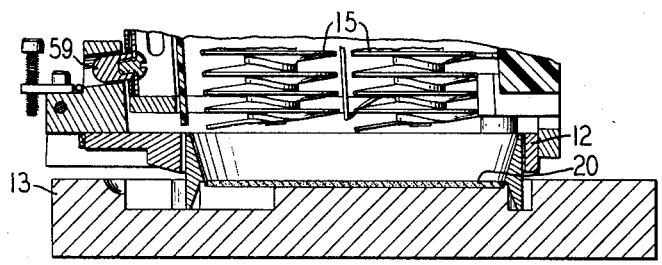
FIG. 8 shows the lower portion of FIG. 7 with a dispensed wafer resting on the base member.

Referring to FIGS. 7 and 8, the dispensing adapter 12 is shown attached to the lower portion of the wafer feed machine 10. This adapter provides a convenient guide to insure that a wafer ejected from the feed machine is properly positioned on a work surface. More particularly, the adapter 12 is shown in association with a particular base member 13 designed to be used in conjunction with the collecting adapter to be described hereinafter. Referring to FIG. 7, the dispensing adapter 12 is attached to the lower portion of the wafer feed machine 10 by means of a latch 59 operated by a latch knob 60. Positioning of the wafer feed machine is facilitated as shown in FIG. 1 by locating the knob 61 of the positioning arm 62 in a recess in the base member 13. This locates the adapter 12 over a particular surface of the base member 13. In FIG. 7 the wafer 20 is shown in the lowest full thread of the feed screws 15. Actuation of the feed screws 15 in the dispensing mode releases the wafer 20 and it drops within the walls of the dispensing adapter 12 to the surface of the base member 13 as shown in FIG. 8.

It will be appreciated that the wafer feed machine 10 may be used in the dispensing mode without the dispensing adapter 12 to place wafers on any suitable flat surface with a considerable degree of accuracy. However, if it is desired to return wafers from a flat surface to the wafer feed machine for transfer back to a wafer cassette, the collecting adapter 63 is used in conjunction with the special base member 13.

Figure 9:
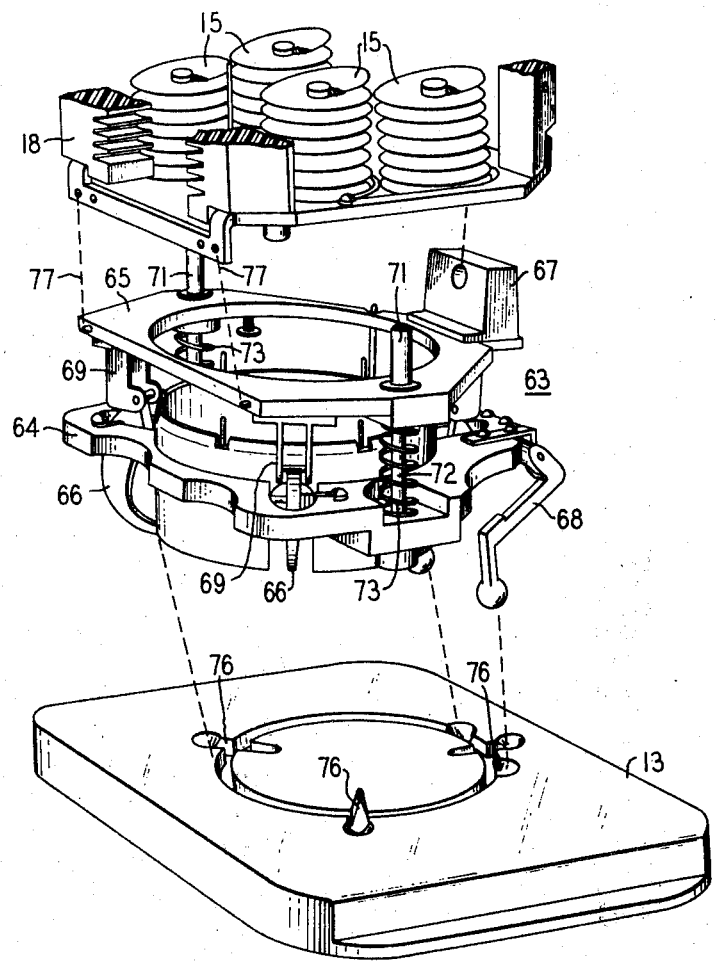
FIG. 9 is a perspective view, in exploded form, of the lower portion of the wafer feed machine, the collecting adapter, and base member.

In FIG. 9, the collecting adapter 63 is shown in separated relation with the lower portion of the wafer feed machine 10 and the special base member 13. The adapter 63 includes a collar 64 and a plate 65 which are held in spaced-apart connected relation by the guide shafts 72 and springs 73. The adapter 63 is attached to the wafer feed machine by a latch which engages the lug 67 similar to the latching arrangement for the dispensing adapter 12 and by alignment pins and recesses linked by the broken lines 77.

Figure 10:
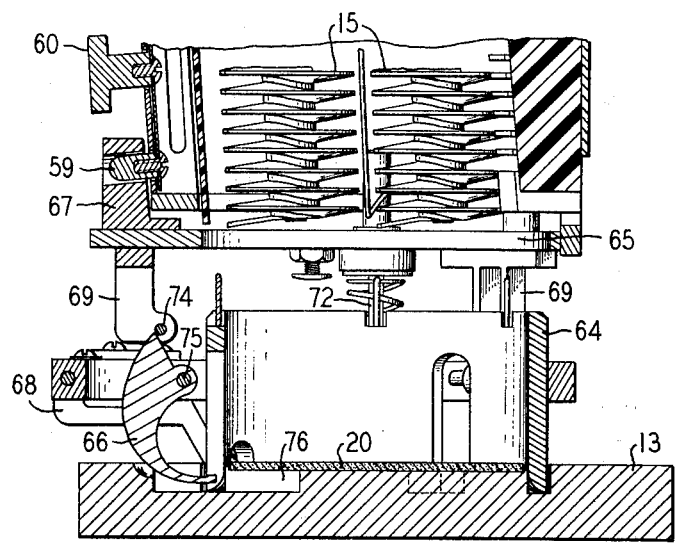
FIG. 10 is a side elevation view, in section, of the lower portion of the wafer feed machine with attached collecting adapter and base member with a wafer on the base member preliminary to collection.
Figure 11:
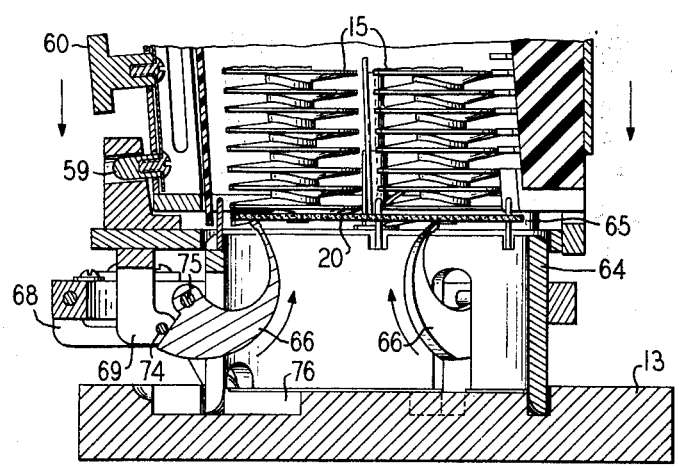
FIG. 11 is similar to FIG. 10, showing the collecting adapter depressed so as to elevate the wafer into the end of the feed screws of the wafer feed machine.

In FIG. 10, the collecting adapter 63 is shown coupled to the feed machine and positioned on the base member preparatory to retrieving a wafer 20. The relation of the latch 59 and latch knob 60 to the lug 67 is shown in more detail. The collar 64 carries three equispaced arms 66 which are actuated by cooperating brackets 69 which are fixed to the plate 65. The brackets 69 include a bracket pin 74 which bears against a camming surface of the arm 66. Referring to FIG. 11, the collecting adapter 63 has been actuated by applying downward pressure against the bias of the springs 73 to force the plate 65 against the collar 64. This action causes the brackets 69 to rotate the arms 66 about the pins 75. The base member 13 contains recesses which enable the arms 66 to swing under the wafer 20 and, as shown in FIG. 11, elevate the wafer into the end of the feed screws 15. With the wafer 20 in this position the feed screws 15 are rotated in the opposite or "collect" direction which moves the wafer 20 axially upward within the wafer feed machine. Wafers thus collected into the feed machine may be transferred subsequently into a wafer cassette in a reversal of the initial dump transfer of wafers from cassette to feed machine.

Although this apparatus has been described as providing both the dispensing and collecting function, there are wafer processing applications in which dispositions other than returning them to cassettes, are made of the wafers. For these, as well as other arrangements, the wafer feed machine may be constructed more simply to provide only the dispensing function or the collecting function and the drive mechanism thus will provide only one direction of rotation of the feed screws. Also, the dispensing adapter may be omitted for such functions. Likewise, the collecting adapter may be made an integral part of the wafer feed machine in such case.

As previously noted, various mechanical details including for example latches, interlocks and structural fastenings, have been omitted as within the skill of the art to provide. Moreover, it will be understood that although a preferred and advantageous drive mechanism has been disclosed, other equivalent variations may be employed providing other coupling means and gear ratios. Moreover, means such as pneumatic, hydraulic and electric power may be used in place of hand operation for the drive mechanism. The wafer feed machine and asociated appurtenances also may be constructed in sizes to accommodate semiconductor wafers of various diameters. Likewise, the materials from which the wafer handling apparatus are not particularly critical except for those parts which are in direct contact with the semiconductor wafers. For example, the feed screws 15 advantageously may be of molded nylon in accordance with current practice in the art for articles such as the wafer cassettes which, likewise, are fabricated from this material. All these and other variations are regarded as falling within the scope and spirit of the invention.

What is claimed is:

1. Wafer handling apparatus for transferring semiconductor wafers from spaced-apart stack form in a cassette to single wafers positioned on a horizontal work surface and the reverse process from single wafer to stack form in a cassette comprising,
- a wafer feed machine including feed screw means for moving wafers in the axial direction of said means,
- said machine including means for receiving a plurality of wafers in said feed screw means simultaneously,
- said wafer feed machine further having means for dispensing and receiving a single wafer at an end of said feed screw means,
- and wafer collecting means comprising a wafer collecting adapter cooperative with said wafer feed machine,
- said wafer collecting adapter including means for retrieving and feeding a semiconductor wafer into an end of said feed screw means of said wafer feed machine.

2. Apparatus in accordance with claim 1 in which said wafer collecting means are separable from said wafer feed machine.

3. In a wafer handling apparatus, a wafer feed machine including feed screw means for axially moving a semiconductor wafer, said feed screw means comprising a plurality of screw members rotatably mounted in substantially parallel spaced-apart arrangement, said machine including means for receiving simultaneously a stack of spaced-apart wafers within said plurality of screw members, and drive means for rotating said screw members.

4. Apparatus in accordance with claim 3 in which said feed screw means comprise two pairs of oppositely disposed counter-rotating screw members.

5. Apparatus in accordance with claim 4 in which said drive means are connected in common to said screw members to provide simultaneously uniform rotation.

6. Wafer handling apparatus for transferring semiconductor wafers from spaced-apart stack form in a cassette to single wafers positioned on a horizontal work surface comprising,
- feed screw means for moving said wafers in the axial direction,
- means for receiving a plurality of wafers simultaneously into said feed screw means from a cassette, and
- means for dispensing wafers singly in horizontal disposition from an end of said feed screw means.

7. Apparatus in accordance with claim 6 in which said means for receiving wafers include a pair of oppositely disposed combs in one face of said wafer feed machine for guiding wafers into said feed screws.

8. Wafer handling apparatus for transferring single semiconductor wafers positioned on a horizontal work surface to spaced-apart stack form in a wafer cassette comprising,
- feed screw means for moving said wafers in the axial direction,
- wafer collecting means including means for retrieving and feeding a semiconductor wafer into an end of said feed screw means, and
- means for transferring a plurality of wafers simultaneously from said feed screw means to a wafer cassette.

* * * * *